US007153760B2

(12) United States Patent
Golzarian

(10) Patent No.: US 7,153,760 B2
(45) Date of Patent: Dec. 26, 2006

(54) USING ACOUSTIC ENERGY INCLUDING TWO LASERS TO ACTIVATE IMPLANTED SPECIES

(75) Inventor: Reza M. Golzarian, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 10/720,934

(22) Filed: Nov. 24, 2003

(65) Prior Publication Data

US 2005/0112852 A1 May 26, 2005

(51) Int. Cl.
H01L 21/322 (2006.01)
H01L 21/425 (2006.01)
H01L 21/44 (2006.01)

(52) U.S. Cl. ............... 438/472; 438/514; 438/530; 438/675

(58) Field of Classification Search ........... 438/472, 438/514, 530, 675
See application file for complete search history.

(56) References Cited

U.S. PATENT DOCUMENTS 5,634,718 A * 6/1997 Martinis et al. ............. 374/32

FOREIGN PATENT DOCUMENTS

JP 06077155 * 3/1994
KR 2003002424 A * 1/2003

OTHER PUBLICATIONS

Winkipedia, Infrared definitinon: http://en.wikipedia.org/wiki/Infrared.*
"Laser Diaganostics of Mechanical and Elastic Properties of Silicon and Carbon Films", Applied Surface Science, 106 (1996) pp. 429-437.*
"Intens Ruby-Laser-Induced Acoustic Impulses in Liquids", E.F. Carome et al., The Journal of the Acoustical Society of America, vol. 40, No. 6, 1966, pp. 1462-1466.*

* cited by examiner

*Primary Examiner*—William M. Brewster
(74) *Attorney, Agent, or Firm*—Trop, Pruner & Hu, P.C.

(57) ABSTRACT

Acoustic energy may be utilized to generate phonons for activating implanted species. As a result, greater activation may be achieved with lower thermal budgets. Higher temperatures utilized in conventional processes may result in damage to semiconductor wafers. In some embodiments, the acoustic energy may be coupled with rapid thermal annealing, laser annealing, or other annealing processes. The acoustic energy may be developed by vibrational sources, laser energy, or other sources.

18 Claims, 2 Drawing Sheets

USING ACOUSTIC ENERGY INCLUDING TWO LASERS TO ACTIVATE IMPLANTED SPECIES

BACKGROUND

This invention relates generally to the fabrication of integrated circuits.

In the fabrication of integrated circuits, it is common to form junctions for transistors by ion implantation. For example, using a gate structure as a mask, an ion implantation may form implanted regions. As a result of the ion implantation, damage may occur to the semiconductor substrate. In addition, many of the implanted species may not find substitutional sites.

In order to repair the damage and to activate the species into substitutional sites, it is common to use an annealing or heating step. In modern semiconductor processes rapid thermal annealing may be utilized to apply a high heat in a relatively short amount of time.

Another option is to use laser energy, such as an infrared laser, to rapidly heat the implanted region. Existing efforts to use laser energy have run into difficulties because the laser energy may be so intense it actually melts the gate structures that are already in place on the substrate at the time of the annealing step.

Thus, there is a need for better ways to anneal implanted regions in the manufacture of integrated circuits.

DETAILED DESCRIPTION

Figure 1:
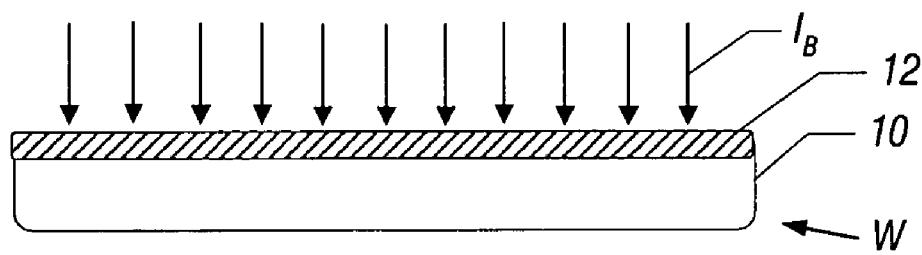
FIG. 1 is an enlarged, schematic view of one stage in the manufacture of a semiconductor integrated circuit in one embodiment of the present invention.
Figure 2:
FIG. 2 is an enlarged, cross-sectional view of a subsequent stage in accordance with one embodiment of the present invention.

Referring to FIG. 1, in accordance with one embodiment of the present invention, a semiconductor manufacturing process may begin by forming an epitaxial layer 10 on a wafer W. The epitaxial layer 10 may be exposed to a boron implant. The boron implant $I_B$ may be a low-resistive high-dose implant, as one example. The boron implanted structure is then subjected to a thermal anneal, for example at 1100° C., as indicated in FIG. 2. As a result of the anneal, the implanted boron diffuses throughout the epitaxial layer 10.

Figure 3:
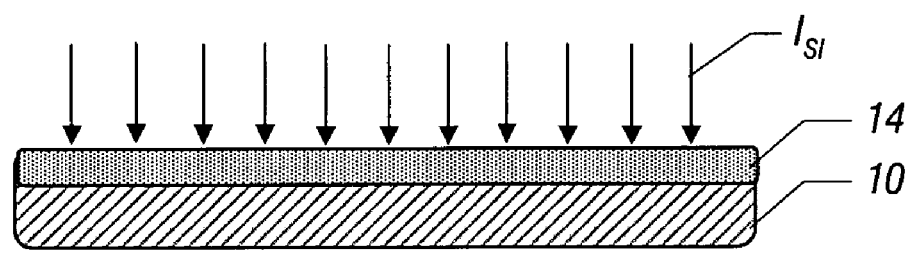
FIG. 3 is an enlarged, cross-sectional view of a subsequent stage in accordance with one embodiment of the present invention.
Figure 4:
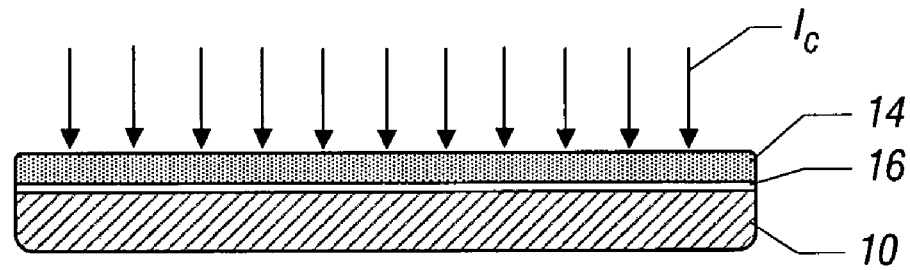
FIG. 4 is an enlarged, cross-sectional view of a subsequent stage in accordance with one embodiment of the present invention.

Referring to FIG. 3, the structure may next be exposed to a silicon preamorphous implant $I_{SI}$ to form a silicon implanted region 14. Next, a carbon implant $I_C$ may be used to form a carbon barrier layer 16 between the silicon layer 14 and the epitaxial layer 10, as shown in FIG. 4.

Figure 5:
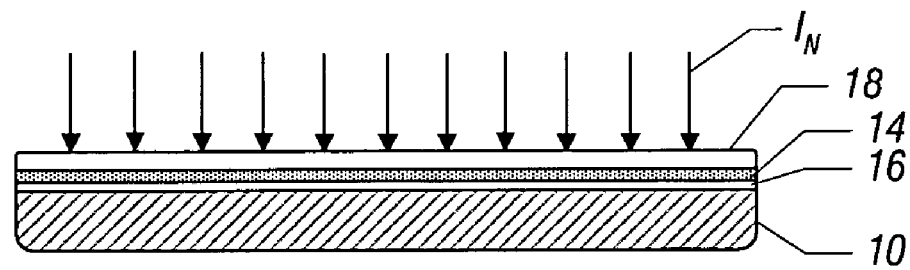
FIG. 5 is an enlarged, cross-sectional view of a subsequent stage in accordance with one embodiment of the present invention.
Figure 6:
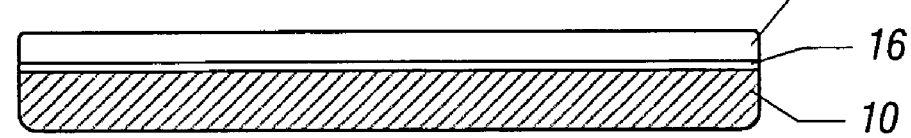
FIG. 6 is an enlarged, cross-sectional view of a subsequent stage in accordance with one embodiment of the present invention.

Next, an N-type species, such as arsenic or phosphorous, may be implanted to form an N-type implanted layer 18 as shown in FIG. 5. Again, a thermal annealing step may be implemented as shown in FIG. 6 to diffuse the implanted N-type impurity and to increase the depth of the layer 18. Conventionally, this annealing step may be a rapid thermal annealing step which increases the depth of the implanted species and activates some, but not all, of the implanted species.

Thus, it would be desirable to activate a higher percentage of the implanted species without damaging the wafer. With laser annealing, a gate structure (not shown), such as a polysilicon gate structure utilized as a mask for the implantation, may be damaged by the high temperatures generated by laser annealing.

Activation may be accomplished without unduly heating the semiconductor structure by using acoustic or phonon activation. For example, two different lasers may be utilized. One laser may be an infrared laser utilized to heat the exposed region to temperatures in excess of 1000° C. The other laser may be substantially lower energy, heating the wafer to substantially less than 1000° C. For example, the second laser may be a laser that produces acoustic energy and generates phonons. Phonons are quanta of acoustic energy and are the acoustic analog of photons in the light domain. Phonon absorption is the absorption of light energy by a lattice and its conversion to vibrational energy. Thus, by exposure to a lower energy laser beam, phonon absorption may occur. The polysilicon layer may be protected via laser annealing at lower temperature while phonon energy is used to activate the implanted species.

The generation of phonons within the implanted regions facilitates the lower temperature activation of the implanted species. This may be accomplished while providing less thermal energy through the higher energy laser exposure. As a result, the semiconductor structure may experience a smaller thermal load, and lower maximum temperatures. This may reduce the thermal damage that results with conventional laser annealing.

Figure 7:
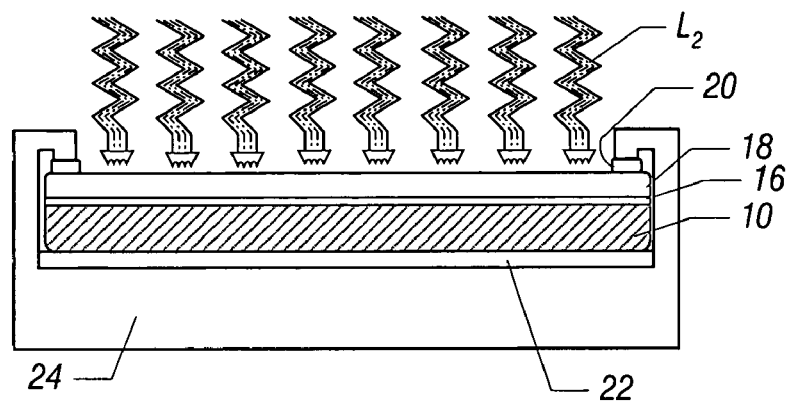
FIG. 7 is an enlarged, cross-sectional view of a subsequent stage in accordance with one embodiment of the present invention.

Referring to FIG. 7, the combined higher and lower energy laser beams L2 may expose the implanted layer 18. Phonon absorbing materials 20 may support the layer 18 and may be coupled to a wafer carrier 24. A phonon reflector 22 may be provided under the wafer 10. As a result of the phonon exposure, the percentage of substitutional species may be increased.

Figure 8:
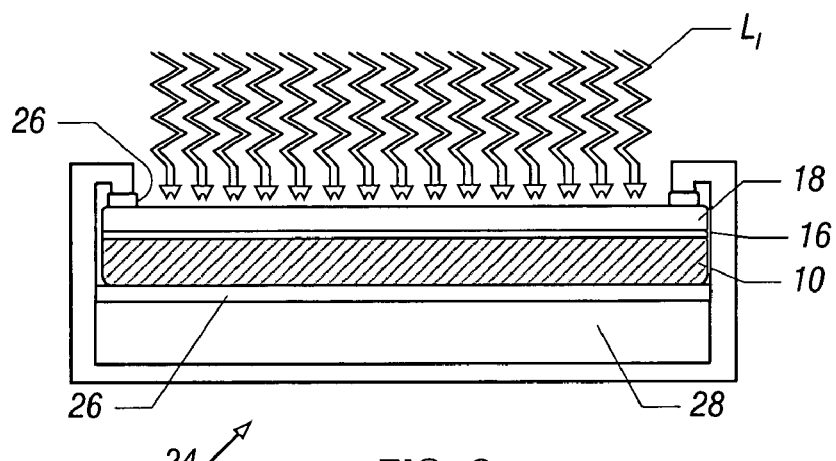
FIG. 8 is an enlarged, cross-sectional view of a stage corresponding to FIG. 7 in an alternative embodiment of the present invention.

While an embodiment is illustrated in which a laser beam is utilized to generate acoustic energy and phonons, other techniques for generating phonons may also be utilized as indicated in FIG. 8. In FIG. 8, a single laser beam L1 may be utilized. The laser beam L1 may be an infrared laser that may be utilized for generating temperatures on the order of 1000° C. The acoustic energy source 28 for generating phonons may be a mechanical vibrational source, such as a piezoelectric transducer. The source 28 may be held within the carrier 24 that also supports the wafer. A phonon coupling region 26 may be provided between the semiconductor wafer and the source 28. The carrier 24 may also include a phonon coupling element 26 above the wafer and above the layer 18 in some embodiments.

Figure 9:
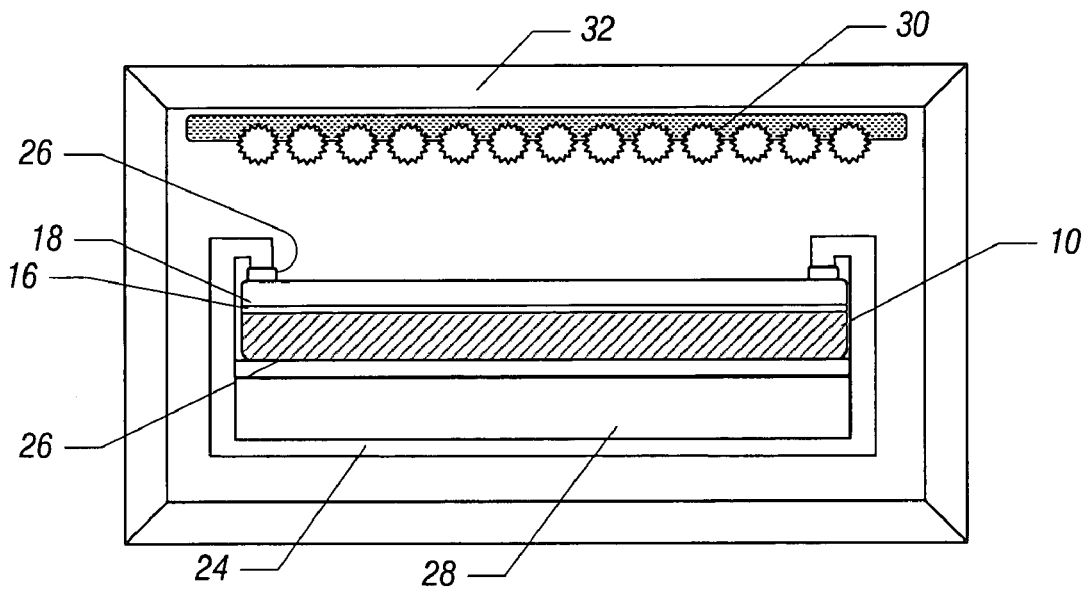
FIG. 9 is an enlarged, cross-sectional view corresponding to the stage as shown in FIGS. 6 and 7 in accordance with still another embodiment of the present invention.

In accordance with still another embodiment of the present invention, shown in FIG. 9, the phonon activation may be coupled with conventional rapid thermal annealing processes. For example, a rapid thermal annealing furnace 32 may have rapid thermal annealing lamps 30. In addition, a wafer may be contained in the carrier 24 which includes the source 28 and the coupling region 26, for purposes of providing acoustic activation of implanted species. The rapid thermal annealing and phonon activation may be done in the same module and at the same time in some embodiments.

Thus, in some embodiments of the present invention, activation may be augmented by phonon generation and acoustic energy. As a result, lower temperatures and lower thermal budgets may be possible in some embodiments of the present invention. Using lower thermal budgets and maintaining lower temperatures may reduce damage to other components associated with the wafer during the annealing step.

A variety of different lasers may be utilized in embodiments in which lasers are used to generate acoustic energy. For example, in one embodiment, pulsed lasers may be utilized. In other embodiments, variable or constant lasers may be utilized. Similarly, the acoustic source 28 may be pulsed, variable, or constant.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    exposing an implanted wafer to an infrared laser; and
    exposing said implanted semiconductor wafer to a second laser at an energy lower than the energy of said infrared laser.

2. The method of claim 1 including exposing an implanted wafer to acoustic energy to activate the implanted species using a mechanical vibration source.

3. The method of claim 2 including using a piezoelectric generator.

4. The method of claim 1 including generating acoustic energy using a laser beam.

5. The method of claim 1 including exposing the implanted wafer to acoustic energy while heating the wafer.

6. The method of claim 5 wherein heating the wafer includes exposing the wafer to rapid thermal anneal lamps.

7. The method of claim 1 including exposing the wafer to two laser beams, said laser beams having different energy, one of said laser beams to heat said wafer and the other of said laser beams to generate phonons.

8. The method of claim 1 including annealing the wafer after ion implantation and subsequently using acoustic energy to activate the implanted species by the generation of phonons.

9. The method of claim 1 including using a piezoelectric transducer to perturb said wafer.

10. The method of claim 9 including using a transducer mounted in a wafer holder to perturb said wafer.

11. The method of claim 1 including applying heat using rapid thermal annealing lamps.

12. The method of claim 1 including mechanically perturbing said wafer in a rapid thermal annealing furnace.

13. The method of claim 1 including heating said wafer and then mechanically perturbing said wafer.

14. A method comprising:
    exposing an implanted semiconductor wafer to a first laser at a first energy to heat said wafer to a temperature in excessive of 1000° C.; and
    exposing said implanted semiconductor wafer to a second laser at a second energy lower than said first energy to heat said wafer to a temperature less than 1000° C.

15. The method of claim 14 including exposing said semiconductor wafer to said second laser to generate acoustical energy.

16. The method of claim 15 including generating acoustical energy to activate implanted species.

17. The method of claim 14 including exposing said semiconductor wafer to said first laser that is a infrared laser.

18. The method of claim 14 including heating said wafer to activate said species.

* * * * *